United States Patent
Sim et al.

(10) Patent No.: US 6,697,984 B1
(45) Date of Patent: Feb. 24, 2004

(54) APPARATUS AND METHOD FOR ADAPTIVE HYBRID ARQ CONCATENATED FEC

(75) Inventors: Ji Seob Sim, Kyonggi-do (KR); Won Sik Yoon, Telecom Institute, Department of Electronics Engineering, Ajoo University, San 5, Wochon-dong, Paldang-gu, Suwon-shi, Kyonggi-do (KR)

(73) Assignees: LG Electronics Inc., Seoul (KR); Won Sik Yoon, Suwon (KR)

( * ) Notice: Subject to any disclaimer, the term of this patent is extended or adjusted under 35 U.S.C. 154(b) by 0 days.

(21) Appl. No.: 09/448,873

(22) Filed: Nov. 24, 1999

(30) Foreign Application Priority Data

May 25, 1999 (KR) ........................................ 1999-18795

(51) Int. Cl.[7] ............................................ H03M 13/00
(52) U.S. Cl. ....................... 714/751; 714/755; 714/774; 714/786; 714/790; 370/316; 370/389
(58) Field of Search ................................ 714/755, 786, 714/790, 751, 774, 708, 753; 370/316, 389, 411

(56) References Cited

U.S. PATENT DOCUMENTS

| | | | | |
|---|---|---|---|---|
| 5,828,677 A | * | 10/1998 | Sayeed et al. | 714/774 |
| 6,157,642 A | * | 12/2000 | Sturza et al. | 370/389 |
| 6,202,189 B1 | * | 3/2001 | Hinedi et al. | 714/786 |
| 6,263,466 B1 | * | 7/2001 | Hinedi et al. | 714/755 |

* cited by examiner

Primary Examiner—Emmanuel L. Moise

(57) ABSTRACT

Adaptive hybrid ARQ methods and apparatuses using a concatenated FEC are disclosed. One method includes dividing data to be transmitted into a header and a payload. The header and payload are encoded to divide them into a plurality of headers and payloads. The plurality of headers and the plurality of payloads are combined to generate a plurality of combined packets. The plurality of combined packets are combined with different perforation patterns, to generate a plurality of transmission packets, and the transmission packets are sequentially transmitted according to an error generation report.

23 Claims, 7 Drawing Sheets

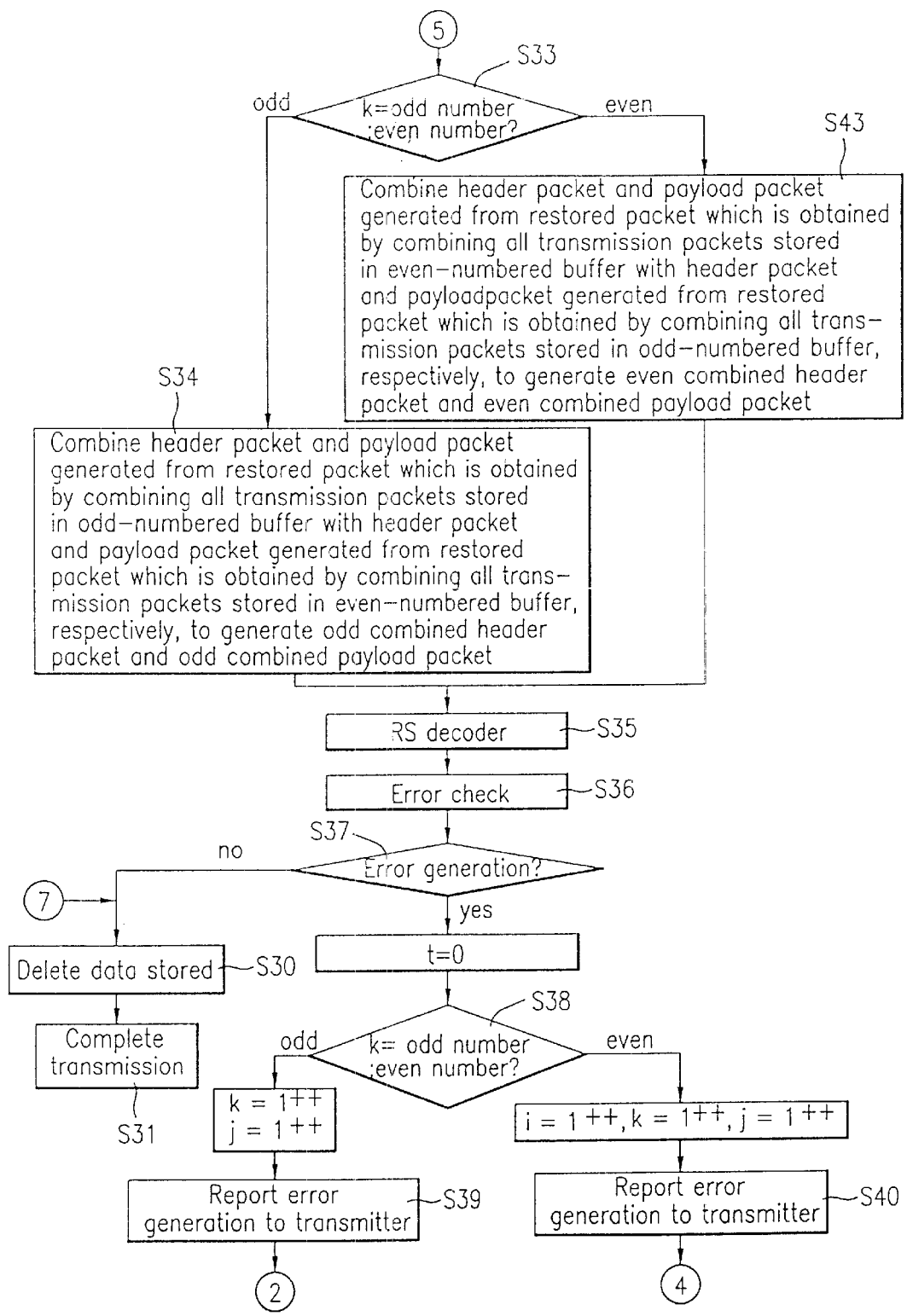

APPARATUS AND METHOD FOR ADAPTIVE HYBRID ARQ CONCATENATED FEC

BACKGROUND OF THE INVENTION

1. Field of the Invention

The present invention relates to a wireless asynchronous transfer mode: WATM) and, specifically, to an apparatus and method for adaptive hybrid automatic repeat request (ARQ) using a concatenated forward error correction (FEC), which controls the code rate of Reed Solomon (RS) code and complementary punctured convolutional (CPC) code according to channel environments to restore information with only transmitted sequence.

2. Discussion of Related Art

WATM systems are being studied for future broadband multimedia transmission. To support multimedia applications, WATM should provides quality of service (QOS) required by the type of transmitted data (data, voice, video). Accordingly, the WATM payload is coded so that various errors according to the QOS can be corrected.

There are two methods of correcting errors transmitted from a transmission side to a reception side. The first one is the forward error correction (FEC) which exchanges data in a continuous form between the transmission and reception sides without accepting interrupt. The second one is the automatic repeat request (ARQ) method in which, when an error is generated in a transmission section, the transmission side is informed of the generation of error and then repeatedly transmits the block having the error. This method makes periodic interrupt possible.

The FEC does not requires a buffer because data flow is not interrupted from the data generation source. Thus, this is used when the buffer is not able to be externally provided or there is no economy. Furthermore, the FEC is suitable for the public broadcasting channel which has various requests for the error rate and accepts a variety of users. Moreover, it is able to satisfy quality of service required by data even when a channel environment is not good. However, FEC coding needs unnecessary overheader to increase cost of apparatus, and deteriorates transmission efficiency in a good channel environment due to propagation delay.

The ARQ method is divided into a stop and wait ARQ, continuous ARQ, and adaptive ARQ. The ARQ need a reverse channel. The transmission side is required to be able to accept interrupt whenever a received data block has an error. Thus, when the reception side informs the transmission side of generation of error, the transmission side repeatedly transmits the data block having the error instead of a new data block. Accordingly, an ARQ system requires a buffer which stores the data block being transmitted. The size of the buffer is determined by the size and number of the data block stored therein. In the ARQ method, when an error creates in a block, retransmission is carried out without regard to the number of error bits which exist in the block. Accordingly, data is re-transmitted in blocks even if one error is generated in one block. This results in inefficient transmission. To improve the transmission efficiency and bandwidth efficiency, an FEC which is powerful and has variable code rate, ARQ and interleaving are required.

There has been proposed recently a hybrid ARQ method using a rate-compatible punctured convolutional (RCPC) code or rate-compatible convolutional (RCC) code for effectively increasing the transmission efficiency on the wireless ARM, to be adaptively used according to the channel environment. The hybrid ARQ method repeats transmission of spare bits which were not transmitted by a transmitter to a receiver according to perforation matrix when a transmitted data packet is lost or severely damaged. Then, the re-transmitted spare bits are combined with packets previously transmitted in order to form a convolutional code, to thereby restore the damaged packet.

As described above, the RCPC or RCC encoder provides the error correction capability which is varied with limited puncturing modes. In the hybrid ARQ method using the RCPC or RCC encoder, when data transmission is carried out from a transmitter to a receiver, the transmitter reduces the number of data bits being transmitted using perforation matrix to decrease overheader which creates during the transmission. Furthermore, when an error is generated in the transmitted data, the remaining data bits which were not transmitted by the perforation matrix is transmitted to be combined with the data previously transmitted, performing error correction.

The hybrid ARQ method, as described above, reduces the overheader which is generated when the data is transmitted from the transmitter to the receiver, and combines the transmitted data with the re-transmitted spare bit when the error creates in the transmitted data to restore the data information. The conventional ARQ method using the RCPC or RCC encoder is available in case that data is transmitted in a good environment so that the data is barely damaged. However, when the data is lost or severely damaged due to fading or interference in a poor environment, there is a limitation in restoring the data even if the spare bits are transmitted.

SUMMARY OF THE INVENTION

Accordingly, the present invention is directed to an apparatus and method for adaptive hybrid ARQ using a concatenated FEC that substantially obviates one or more of the problems due to limitations and disadvantages of the related art.

An object of the present invention is to provide an apparatus and method for adaptive hybrid ARQ using a concatenated FEC, which improves error correction capability of RS and CPC codes using a combining method to restore damaged data information with the help of data bits which are transmitted for error correction.

To accomplish the object of the present invention, there is provided an adaptive hybrid ARQ method using a concatenated FEC, which includes the steps of: puncturing a data packet to be transmitted to divide it into a first and second combined packets, encoding them with first perforation patterns different from each other, to generate a first and second transmission packets; selecting one of the first and second transmission packets and transmitting it to a receiver; the receiver generating a third combined packet using a perforation pattern corresponding the first transmission packet when it receives the first transmission packet; generating a first header packet and a first payload packet from the third combined packet and performing a first error detection; when any error is detected in the first error detection step, a transmitter sending the second transmission packet to the receiver, and the receiver generating a fourth combined packet using a perforation pattern corresponding to the second transmission packet; generating a second header packet and a second payload packet from the fourth combined packet and performing a second error detection; when any error is detected in the second error detection step, combining the first header packet with the second header packet, combining the first payload packet with the second payload packet, and performing a third error detection in the each combined packet; and when any error is not detected in the first, second and third error detection steps, completing data transmission.

Perforation pattern is transmitted, it is decoded using the second perforation pattern to generate a combined packet, and the combined packet is checked.

To accomplish the object of the present invention, there is also provided an adaptive hybrid ARQ apparatus using a concatenated FEC, the apparatus having a transmitter and a receiver, the transmitter including: an RS encoder for dividing transmission data into a header and payload and encoding each of them into an RS code; an interleaver for generating header packets and payload packets corresponding to code rates by puncturing a signal encoded by the RS encoder, combining each header packet with each payload packet, and interleaving the combined packets; and a CPC encoder for combining the interleaved packets with different perforation patterns.

To accomplish the object of the present invention, there is provided an adaptive hybrid ARQ apparatus using a concatenated FEC, the apparatus having a transmitter and a receiver, the receiver including: a buffer for storing transmission packets received from the transmitter; a CPC decoder for decoding the transmission packets stored in the buffer using different perforation patterns; a deinterleaver for deinterleaving a signal generated by the CPC decoder, to generate header packets and payload packets; and an RS decoder for decoding the header packets and payload packets generated by the deinterleaver into RS codes.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

In the drawings:

FIGS. 3A, 3B, 3C and 3D are flow diagrams showing the operation of the adaptive hybrid ARQ apparatus according to the present invention.

DETAILED DESCRIPTION OF PREFERRED EMBODIMENT

Reference will now be made in detail to the preferred embodiments of the present invention, examples of which are illustrated in the accompanying drawings.

Figure 1:
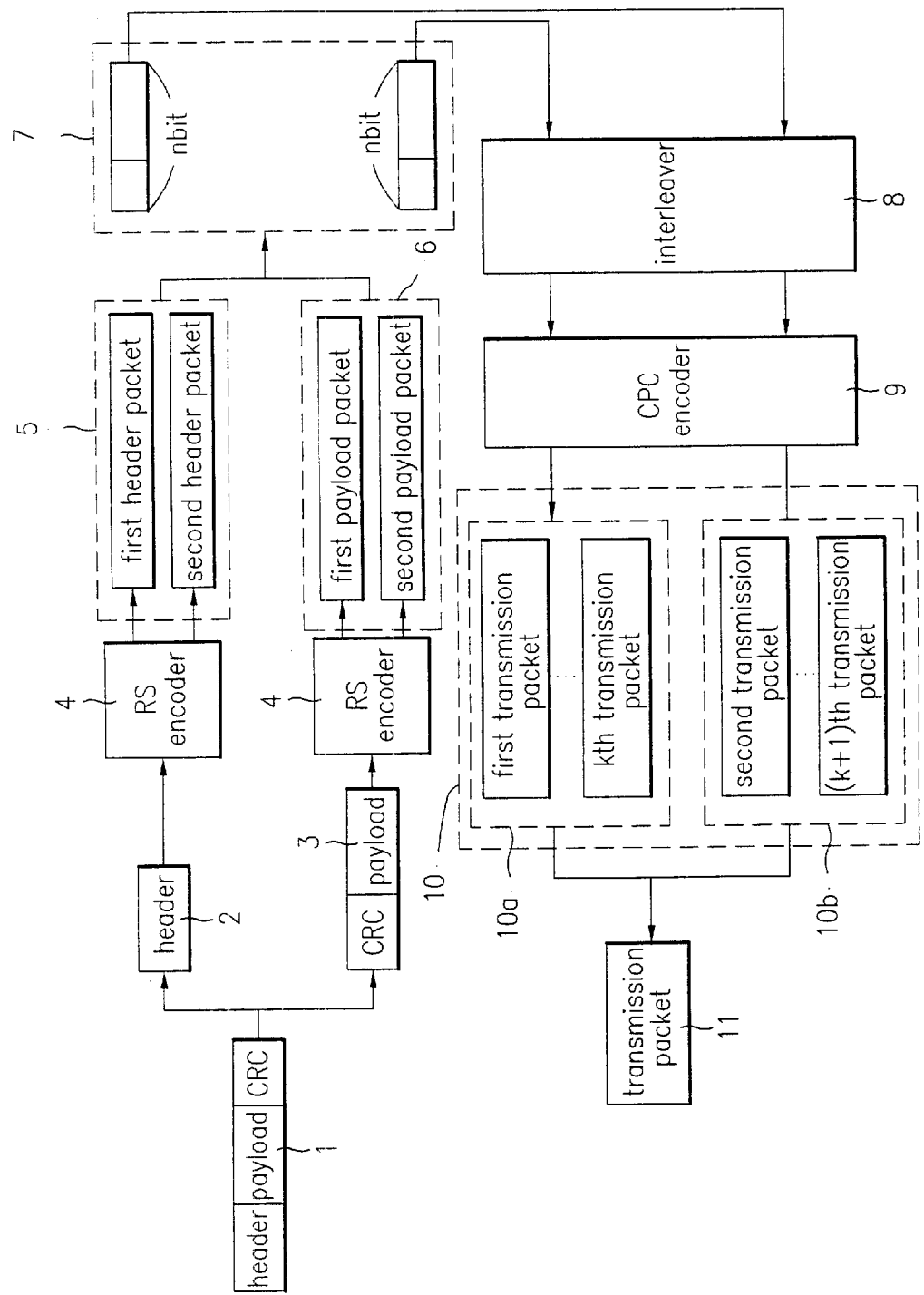
FIG. 1 is a block diagram showing a transmitter of an adaptive hybrid ARQ apparatus according to the present invention.

FIG. 1 is a block diagram showing a transmitter of an adaptive hybrid ARQ apparatus according to the present invention. Referring to FIG. 1, the transmitter includes an RS encoder 4 for dividing transmission data 1 into a header 2 and payload 3 and respectively encoding them into RS codes, an interleaver 8 for puncturing the signals encoded by RS encoder 4 to generate header packets 5 and payload packets 6 corresponding to code rates, combining each, header packet with each payload packet to create a combined packet 7, and interleaving each combined packet 7, and a CPC encoder 9 for combining perforation patterns of the plurality of interleaved packets and encoding them to generate a plurality of transmission packets.

Figure 2:
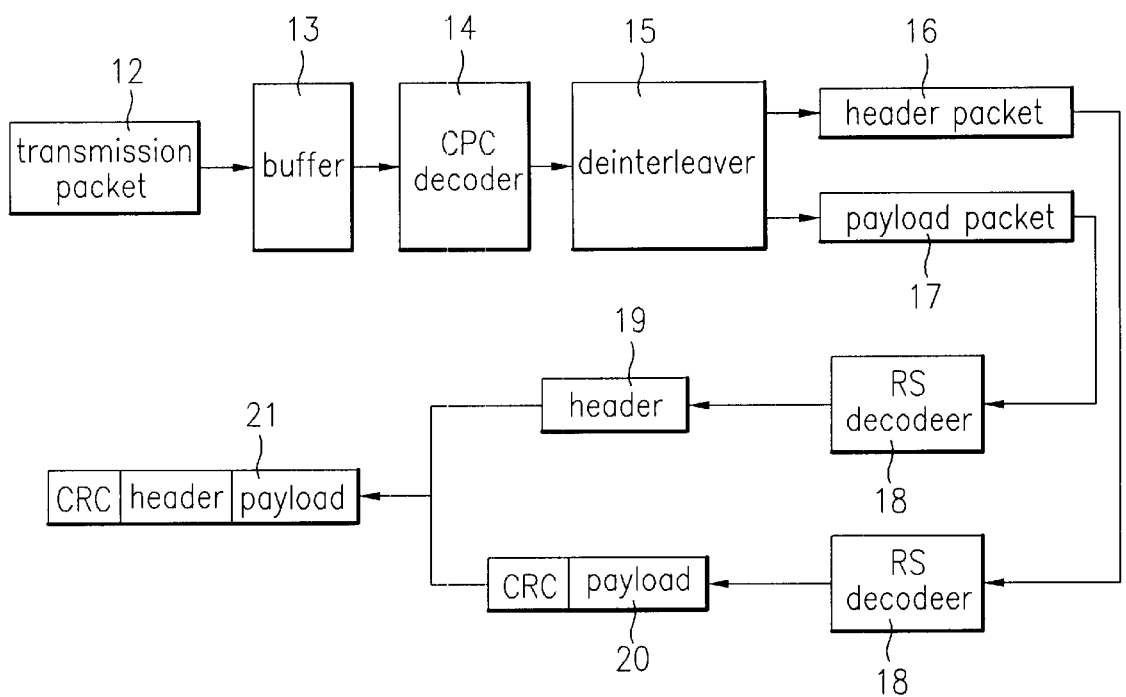
FIG. 2 is a block diagram showing a receiver of the adaptive hybrid ARQ apparatus according to the present invention.
Figure 3A:
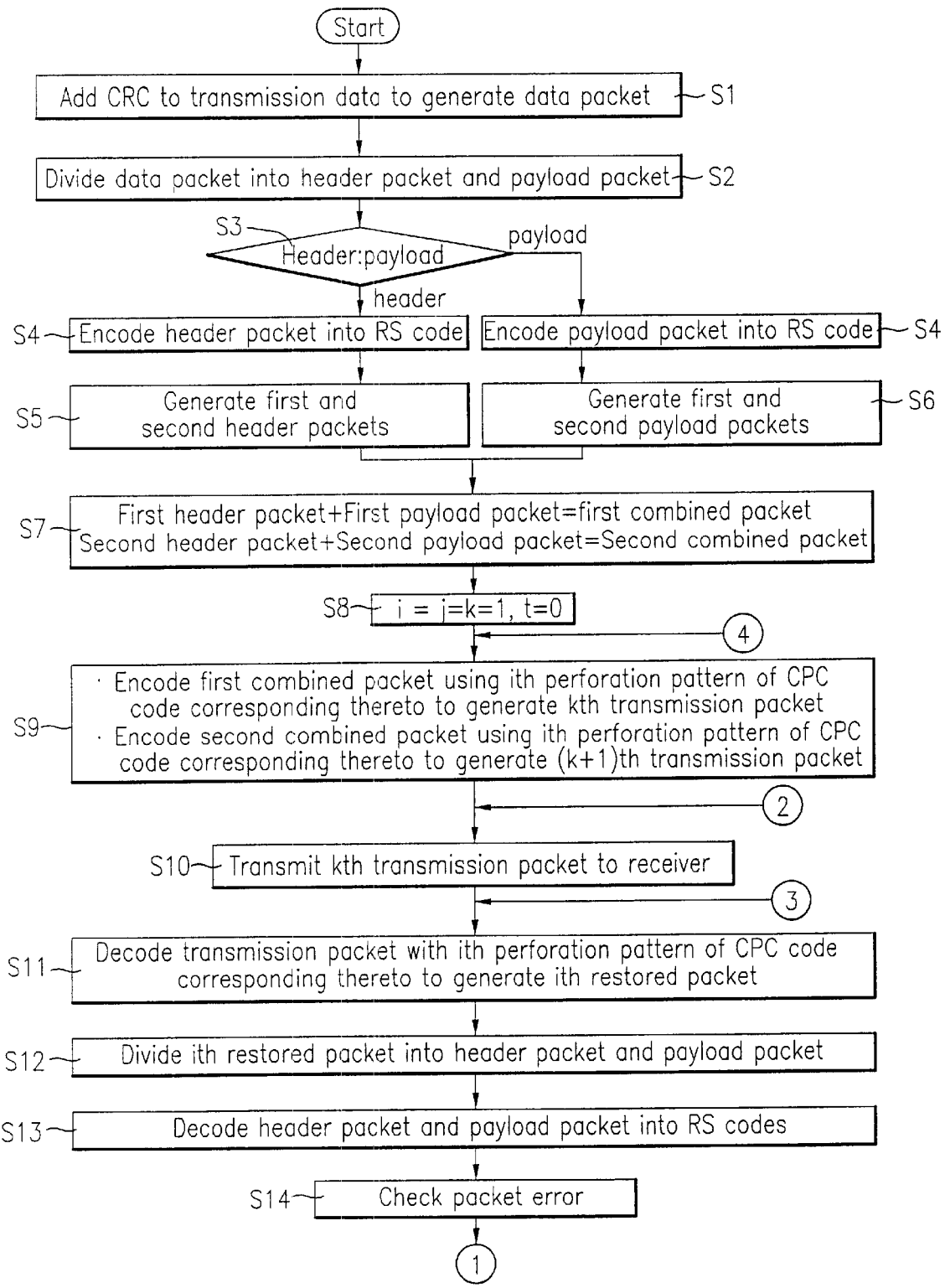
Figure 3B:
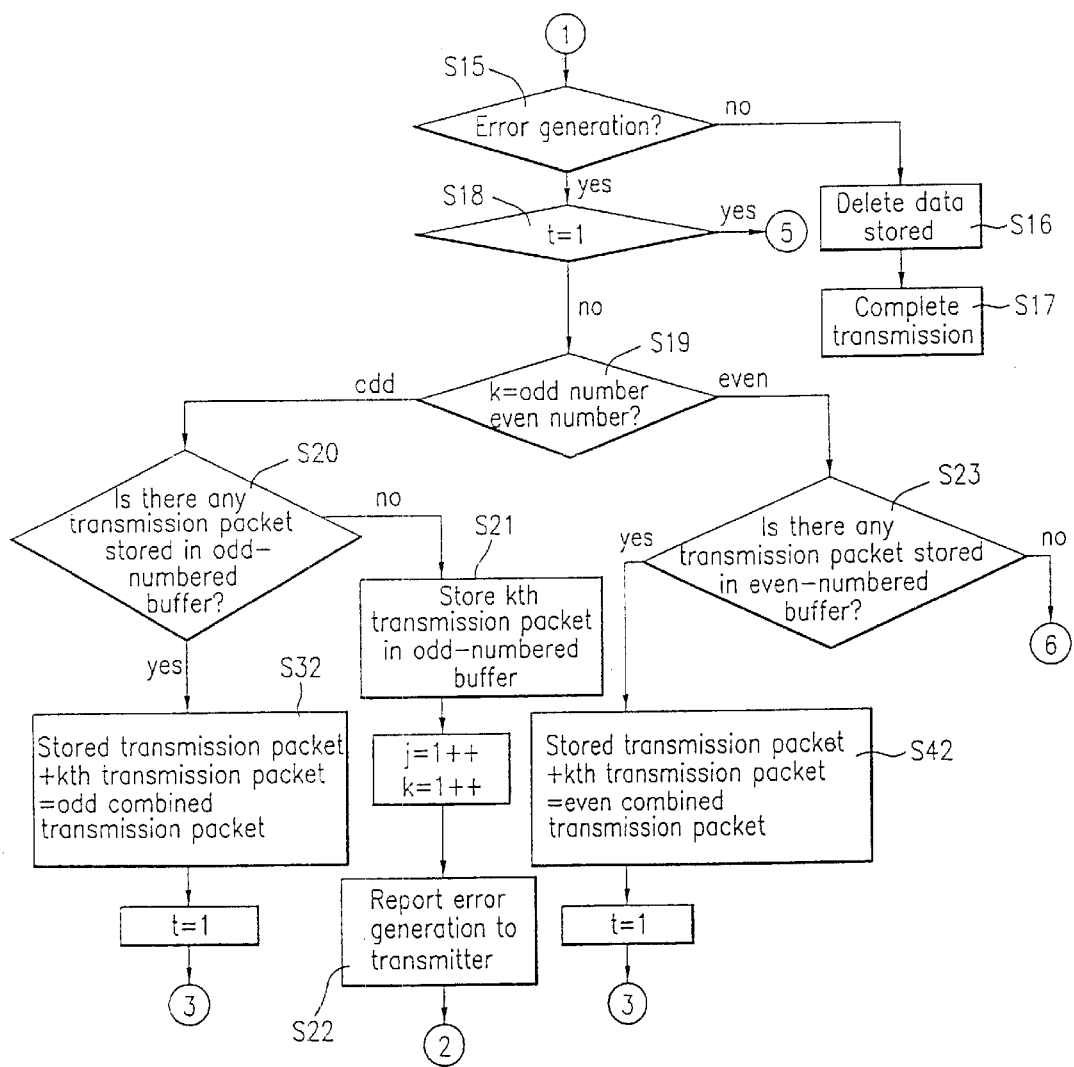
Figure 3D:
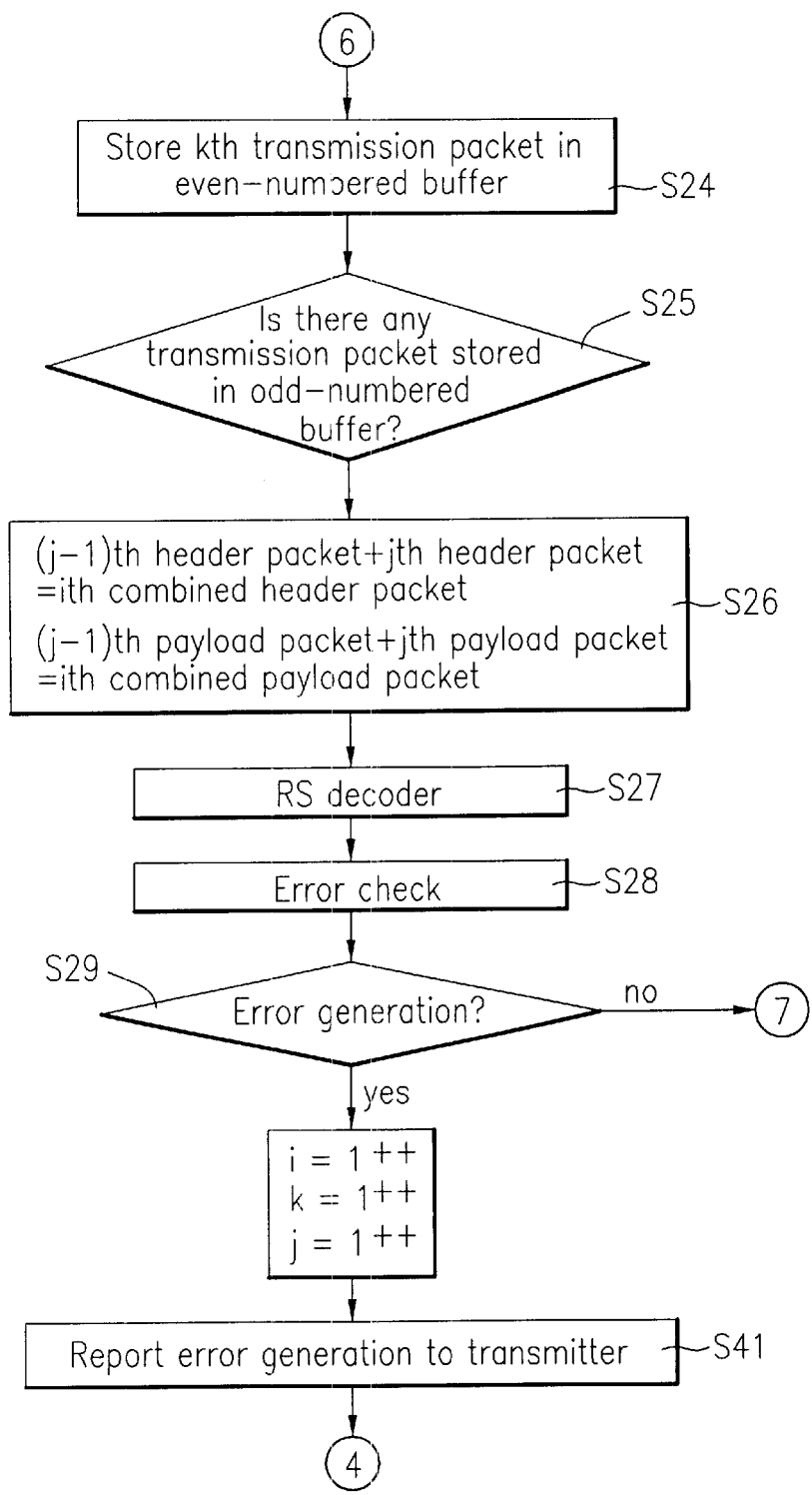

FIG. 2 is a block diagram of a receiver of the adaptive hybrid ARQ apparatus according to the present invention. Referring to FIG. 2, the receiver includes a buffer 13 for storing the combined packets received from the transmitter, a CPC decoder 14 for decoding transmission packets 12 stored in buffer 13 using the perforation patterns, a deinterleaver 15 for deinterleaving the output signal of CPC decoder 14 to generate a header packet 16 and payload packet 17, and an RS decoder 18 for decoding header packet 16 and payload packet 17 output from deinterleaver 15 according to an RS code.

FIGS. 3A, 3B, 3C and 3D are flow diagrams showing the operation of the adaptive hybrid ARQ apparatus according to the present invention. The transmitter combines data to be transmitted with a cyclic redundancy check (CRC) for error check, to generate a data packet 1 (step S1). Then, data packet 1 is divided into header 2 and payload 3 (step S2). The CRC for checking the transmission data error is included in the payload packet. The reason that data packet 1 is divided into header 2 and payload 3 is to effectively correct various errors being generated during the data transmission by transmitting the data with divided address value and data value.

When data packet 1 is classified into header packet 2 and payload packet (S3), each packet is encoded into an RS code by RS encoder 4 (step S4). RS-encoded header packet 2 and payload packet 3 are respectively divided into first and second header packets 5 and first and second payload packets 6 corresponding to a code rate by puncturing in order to improve error correction capability of the RS code using the combining method when the receiver side requests re-transmission of the data due to generation of error (step S6). Here, when the header portion and payload portion of RS encoder 4 before puncturing are $(n_H,5)$ and $(n_L,50)$, respectively, the first and second header packets of the header portion become $((n_H/2),5)$ and $((n_H/2),5)$, respectively, and the first and second payload packets of the payload portion become $((n_L/2),50)$ and $((n_L/2),50)$, respectively, after puncturing. As described above, the error correction capability t of the RS code is determined by the data type and channel environment.

The first header packet and the first payload packet are combined with each other to generate the first combined packet, and the second header packet and the second payload packet are combined with each other to generate the second combined packet (step S7). Thereafter, combined packets 7 are interleaved, and the interleaved first combined packet is encoded into a CPC code having a first perforation pattern, generating the first transmission packet (step S9). The second combined packet is encoded into a CPC code with a different first perforation pattern, generating the second transmission packet (Step S9).

Subsequently, the transmitter selects first transmission packet 10a corresponding to the first combined packet and transmits it to the receiver (step S10). Here, when the transmitter is informed of generation of error after transmission of the first transmission packet, it selects second transmission packet 10b corresponding to the second combined packet and sends it to the receiver. That is, first transmission packet 10a and second transmission packet 10b having the perforation patterns different from each other are alternately transmitted, to effectively solve interference generated during the data transmission.

The receiver decodes first transmission packet 12 with the first perforation pattern of the CPC code corresponding thereto, to generate a first restored packet (step S11). The first restored packet passes through deinterleaver 15, to be divided into first header packet 16 and first payload packet 17 (step S12). Then, first header packet 16 and first payload packet 17 are respectively decoded into RS codes (step S13), and checked if they have errors using the CRC (step S14). First header packet 16 and first payload packet 17 have the error correction capabilities according to the RS decoder, corresponding to $t(1/H)$ and $t(1/L)$, respectively.

When there is no error detected (step S15), the data stored in the buffer is removed (step S16), and then the data transmission is completed (step S17). On the other hand, when any error is detected (S15), the transmission packets are classified by odd-numbered packets and even-numbered packets (step S19). That is, the first, third, fifth, . . . transmission packets are the cdd-numbered and the second, fourth, sixth, . . . transmission packets are the even-numbered. Thereafter, it is checked if there is a transmission packet stored in an odd-numbered buffer because the first transmission packet has been received (step S20) When there is no transmission packet stored in the odd-numbered buffer, the first transmission packet is stored in the odd-numbered buffer (step S21), and error generation is reported to the transmitter (step S22). Then, the transmitter sends the second transmission packet to the receiver (step S10).

The receiver accepts the second transmission packet and decodes it with the first perforation pattern of the CPC code corresponding thereto, which is different from the first perforation pattern combined with the first transmission packet, to generate the second restored packet (step S11). Subsequently, the second restored packet is divided into the header packet and payload packet (step S12), and each of the header packet and payload packet is decoded into the RS code (step S13). Then, error detection is carried out through the CRC (step S14). Where there is no error detected, the data stored in the buffer is deleted (step S16), completing the data transmission (step S17). When any error is detected, since the second transmission packet corresponding to the even-numbered (step S19), it is checked if there is a transmission packet stored in the even-numbered buffer (step S23).

When there is no transmission packet stored in the even numbered buffer, the second transmission packet is stored therein (step S24), and then it is checked if there is any transmission packet stored in the odd-numbered buffer (step S25). Here, the first transmission packet has been stored in the odd-numbered buffer. Thus, the head packet generated from the first transmission packet stored in the odd-numbered buffer is combined with the head packet generated from the second transmission packet, to create the first combined header packet (step S26). Furthermore, the payload packet generated from the first transmission packet stored in the odd-numbered buffer is combined with the payload packet generated from the second transmission packet, thereby creating the first combined payload packet (step S26).

The first combined header packet and the first combined payload packet are decoded into RS codes (step S27), and then error detection is carried out according to the CRC (step S28). At this time, error correction capability according to the RS decoder is increased by $t(2/H)$ and $t(2/L)$ for the first combined header packet and the first combined payload packet, respectively. When there is no error detected (S29), the data stored in the buffer is deleted (S30) and the data transmission is finished (S31). On the other hand, when any error is detected, error generation is reported to the transmitter (S41).

When the transmitter receives the error generation report, it transforms the different first perforation patterns according to the generation of the first and second transmission packets into different second perforation patterns. The first combined packet is encoded using the second perforation pattern of the CPC code corresponding thereto, to generate a third transmission packet 10a (S9). The second combined packet is encoded using the second perforation pattern of the CPC code corresponding thereto, to generate a fourth transmission packet 10b (S9). Upon transmission of the third transmission packet from the transmitter to the receiver, the receiver decodes the third transmission packet with the second perforation pattern of the CPC corresponding to the first combined packet, to generate a third restored packet (S11). The third restored packet is divided into the header packet and payload packet (S12), and they are decoded into RS codes (S13). The error correction capabilities according to the RS decoder correspond to $t(1/H)$ and $t(1/L)$ for the header packet and payload packet, respectively.

Subsequently, error detection is performed through the CRC (S14). When there is no error detected (S15), the data stored in the buffer is deleted (S16), completing the data transmission (Sl7). On the other hand, when there is any error detected (S15), it is checked if there is any transmission packet stored in the odd-numbered buffer because the third transmission packet corresponds to the odd-numbered (S20). Here, the odd-numbered buffer has stored the first transmission packet. Thus, the first transmission packet stored in the odd-numbered buffer is combined with the third transmission packet, and this combined transmission packet is stored in the odd-numbered buffer (S32).

The transmitter decodes the combined transmission packet using a perforation pattern corresponding thereto, to generate a restored packet (S11) This restored packet is divided into the header packet and payload packet (S12), and then they are decoded into RS codes (Sl3). Thereafter, error detection is carried out using the CRC (S14). When there is no error detected, the data stored in the buffer is removed (S16), finishing the data transmission (S17). When an error is detected, the header packet and payload packet created from the restored packet generated by the first and third transmission packets are combined with the header packet and payload packet generated by the second transmission packet, respectively, to create an odd combined header packet and odd combined payload packet (S34).

The odd combined header packet and the odd combined payload packet are decoded into RS codes (S35), and then error detection is performed using the CRC (S36). When there is no error detected (S37), the data stored in the buffer is deleted (S30), completing the data transmission (S31). On the other hand, there is an error detected, this is reported to the transmitter (S39). Upon reception of error generation resort, the transmitter sends the fourth transmission packet to the receiver (S10). The receiver decodes the fourth transmission packet using the second perforation pattern of CPC code corresponding to the second transmission packet, to generate a fourth restored packet (S11). This fourth restored packet is divided into the header packet and payload packet (S12) and they are decoded into RS codes (S13). Thereafter, error detection is executed through the CRC (S14).

When the CRC does not detect any error (S15), the data stored in the buffer is removed (S16), finishing the transmission (S17). When there is any error detected (S15), it is checked if there is a transmission packet stored in the even-numbered buffer because the fourth transmission packet corresponds to an even-numbered one. At this time, the even-numbered buffer has stored the second transmission packet. Then, the second transmission packet stored therein is combined with the fourth transmission packet, and this combined even transmission packet is stored in the even-numbered buffer (S42).

The even combined transmission packet is decoded using a perforation pattern of CPC code corresponding thereto, to generate a restored packet (S11). This restored packet is divided into the header packet and payload packet (S12) and they are decoded into RS codes (S13). Thereafter, error detection is performed using the CRC (S14). When there is no error detected, the data stored in the buffer is deleted (S16), completing the transmission (S17). When there is any error detected (S15), the second and fourth transmission packets are combined with each other. The header packet and payload packet are generated using the restored packet generated according to the even combined transmission packet. The first and third transmission packets are combined with each other, The header packet and payload packet are created using the restored packet generated according to the odd combined transmission packet.

The header packets and payload packets generated from the even combined transmission packet and odd combined transmission packet are respectively combined with each other, to generate an even combined header packet and even combined payload packet (S43). The even combined header packet and even combined payload packet are decoded into RS codes (S35), and error detection is carried out using the CRC (S37). When there is no error detected (S37), the stored data is removed (S30), completing the data transmission (S31). On the other hand, when there is any error detected (S37), error generation is reported to the transmitter (S40). The above procedure is repeatedly performed until information is perfectly restored.

Figure 4:
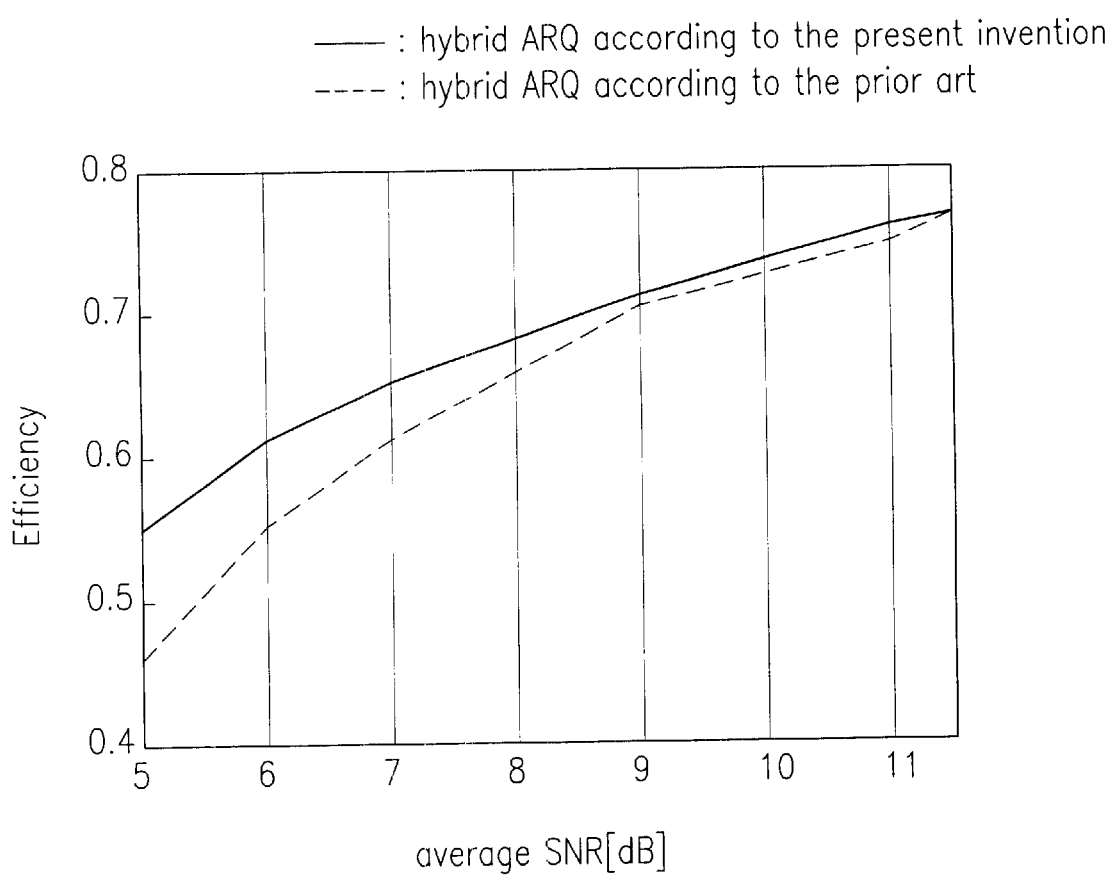
FIG. 4 is a graph showing the transmission efficiency in the rayleigh fading channel environment according to the present invention.

FIG. 4 is a graph showing the transmission efficiency in the rayleigh fading channel environment according to the present invention. The transmission efficiency is represented as R/N. Here, R is the code rate, and N is the average number of n-bit packets which is transmitted for the purpose of accepting n-bit packets correctly. N is expressed by the following equation (1).

$$N = \frac{1}{R_{CI}}(1 + Pr[E_{C_1}^{(1)}, E_{C_2}^{(1)}] + Pr[E_{C_1}^{(1)}, E_{C_1}^{(2)}, E_{C_2}^{(1)}, E_{C_2}^{(2)}] + \ldots) + \frac{1}{R_{C2}}(Pr[E_{C_1}^{(1)}] + Pr[E_{C_n}^{(1)}, E_{C_1}^{(2)}, E_{C_2}^{(1)}] + \ldots)$$

where $E_{Ci}^{(i)}$ means an event that i sequences which have been transmitted for Cj are received and then a decoding error is generated in the RS decoder. $D_{Ci}(i)$ means an event that i codes which have been transmitted for Cj are combined and then a decoding error is generated in the RS decoder. $E_{Ci}^{(i)}$ is the joint event $[D_{Ci}(1), D_{Ci}(i)]$ when $i \leq p$, and the joint event $[D_{Ci}(1), D_{Ci}(p)]$ when $i \geq p$. Here, p represents the number of CPC codes. Accordingly, the equation (1) may be expressed by the following equation (2).

$$Pr[E_{C_1}^{(1)}, E_{C_2}^{(1)}, E_{C_1}^{(2)}, E_{C_2}^{(2)}, \ldots, E_{C_1}^{(i)}, E_{C_2}^{(i)}]$$
$$\leq Pr[D_{C_1}(i)]Pr[D_{C_2}(i)], i < pPr[D_{C_1}(p)]$$
$$mPr[D_{C_2}(p)]^m, i=mp, m=1,2,\ldots D_{C_1}(p)]$$
$$mPr[D_{C_1}(i-mp)]Pr[D_{C_2}(p)]^m Pr[D_{C_2}(i-mp)], mp<i<(m+1)p, m=1,2,$$  (2)

When the equation (2) is substituted for the equation (1), N is represented by the following equation (3).

$$N \leq \frac{1}{R_{CI}}\left(\left(1 + \sum_{i=1}^{p-1} Pr[D_{CI}(i)]Pr[D_{C2}(i)]\right)\frac{1}{1 - Pr[D_{CI}(p)]Pr[D_{C2}(p)]}\right) + \frac{1}{R_{C2}}\left(\left(\sum_{i=1}^{p} Pr[D_{CI}(i)]Pr[D_{C2}(i-1)]\right)\frac{1}{1 - Pr[D_{CI}(p)]Pr[D_{C2}(p)]}\right)$$  (3)

In the equation (3), let $Pr[D_{C2}(0)]=0$. Then, $$Pr[D_{CI}(i)] = \sum_{i=i+1}^{p} \binom{i^n}{} P_{vit}^i (1 - P_{vit})^{n-1}$$

Here, $P_{vit}$ is defined as the symbol error rate at the output terminal of a viterbi decoder. The minimum value of the transmission efficiency can be obtained as described above.

FIG. 4 show the transmission efficiency curve of the conventional hybrid ARQ method using RS and RCC codes and the transmission efficiency curve according to the present invention, on condition that the feedback channel has no error. Referring to FIG. 4, the adaptive hybrid ARQ method according to the present invention has more excellent capability than the conventional hybrid ARQ method using RS and RCC codes.

It will be apparent to those skilled in the art that various modifications and variations can be made in the apparatus and method for adaptive hybrid ARQ using a concatenated FEC of the present invention without departing from the spirit or scope of the invention. Thus, it is intended that the present invention cover the modifications and variations of this invention provided they come within the scope of the appended claims and their equivalents.

What is claimed is:

1. An adaptive hybrid ARQ method using a concatenated FEC, wherein a transmission procedure comprises:
   dividing data to be transmitted into a header and a payload;
   encoding the header and payload to divide them into a plurality of headers and payloads;
   combining the plurality of headers and combining the plurality of payloads, to generate a plurality of combined packets;
   combining the plurality of combined packets with different perforation patterns, to generate a plurality of transmission packets; and
   sequentially transmitting the transmission packets according to error generation report.

2. The method as claimed in claim 1, wherein the encoding is carried out using an RS code.

3. The method as claimed in claim 1, wherein generating the transmission packet uses CPC code.

4. An adaptive hybrid ARQ method using a concatenated FEC, wherein a reception procedure comprises:

receiving a first transmission packet from a transmitter and storing it in a buffer;

dividing the first transmission packet into a first header and a first payload using a perforation pattern corresponding thereto;

decoding the first header and first payload and carrying output error detection;

when there is any error detected, reporting error generation to the transmitter;

receiving a second transmission packet which was combined with a different perforation pattern and transmitted, after error generation is reported;

decoding the second transmission packet into a second header and a second payload and performing error detection;

when any error is detected in the error detecting step, combining the first and second headers and combining the first and second payloads, to generate a first combined header and a first combined payload; and decoding the first combined header and the first combined payload, and performing error detection.

5. The method as claimed in claim 4, wherein dividing the first transmission packet into the first header and the first payload uses a CPC code.

6. The method as claimed in claim 4, wherein the decoding is carried out using an RS code.

7. The method as claimed in claim 4, further comprising:

when there is any error detected, reporting the error generation to the transmitter, and the transmitter receiving a third transmission packet which was combined with a different perforation pattern and transmitted; and dividing the third transmission packet into a third header and a third payload, decoding them, and performing error detection.

8. The method as claimed in claim 7, further comprising when there is any error detected, combining the third transmission packet with the first transmission packet, dividing it into a first odd header and a first odd payload, decoding them, and performing error detection.

9. The method as claimed in claim 8, further comprising, when there is any error detected, combining the first odd header and first odd payload with the second header and second payload, respectively, decoding them, and performing error detection.

10. The method as claimed in claim 9, further comprising:

when there is any error detected, reporting the error generation to the transmitter, and the transmitter receiving a fourth transmission packet which was combined with a different perforation pattern and transmitted; and dividing the fourth transmission packet into a fourth header and a fourth payload, decoding them, and performing error detection.

11. The method as claimed in claim 10, further comprising, when there is any error detected, combining the fourth transmission packet with the second transmission packet, dividing it into a first even header and a first even payload, decoding them, and performing error detection.

12. The method as claimed in claim 11, further comprising, when there is any error detected, combining the first even header and first even payload with the first odd header and first odd payload, respectively, decoding them, and performing error detection.

13. The method as claimed in claim 4, wherein reporting the error generation comprises:

repeating the reception procedure until transmitted information is completely restored; and when the information is completely restored, deleting data stored in the buffer and finishing the data transmission.

14. An adaptive hybrid ARQ method using a concatenated FEC, comprising:

puncturing a data packet to be transmitted to divide it into a first and second combined packets, encoding them with first perforation patterns different from each other, to generate a first and second transmission packets;

selecting one of the first and second transmission packets and transmitting it to a receiver;

the receiver generating a third combined packet using a perforation pattern corresponding the first transmission packet when it receives the first transmission packet;

generating a first header packet and a first payload packet from the third combined packet and performing a first error detection;

when any error is detected in the first error detection step, a transmitter sending the second transmission packet to the receiver, and the receiver generating a fourth combined packet using a perforation pattern corresponding to the second transmission packet;

generating a second header packet and a second payload packet from the fourth combined packet and performing a second error detection;

when any error is detected in the second error detection step, combining the first header packet with the second header packet, combining the first payload packet with the second payload packet, and performing a third error detection in the each combined packet; and when any error is not detected in the first, second and third error detection steps, completing data transmission.

15. The method as claim ed in claim 14, wherein the generating the first and second transmission packets comprises:

encoding the data packet to be transmitted into the first and second header packets and first and second payload packets corresponding to a code rate of RS code;

combining the first and second header packets with the first and second payload packets, respectively, to generate first and second combined packets; and encoding the first and second combined packets into CPC codes having a first perforation pattern corresponding thereto, to generate the first and second transmission packets.

16. The method as claim ed in claim 14, further comprising, when any error is detected in the first, second or third error detection step even after all the first and second transmission packets having the first perforation pattern have been transmitted, encoding each of the first and second combined packets using a second perforation pattern different from the first perforation pattern, generating and transmitting the third and fourth transmission packets, and performing the first, second and third error detection steps.

17. The method as claim ed in claim 16, further comprising:

when any error is detected in the first, second or third error detection step even after the third transmission packet generated according to the second perforation pattern has been transmitted, repeatedly performing the first, second and third error detection steps using the first combined transmission packet which is obtained by combining the first transmission packet according to the first perforation pattern with the third transmission packet according to the second perforation pattern;

when any error is detected in the repeated error detection step, repeatedly performing the first, second and third error detection steps using the fourth transmission packet; and when any error is detected in the error detection steps using the fourth transmission packet, repeatedly performing the first, second and third error detection steps using the second combined transmission packet which is obtained by combining the second transmission packet according to the first perforation pattern with the fourth transmission packet according to the second perforation pattern.

18. The method as claim ed in claim 16, wherein, after the transmission packet generated according to the second perforation pattern is transmitted, it is decoded using the second perforation pattern to generate a combined packet, and the combined packet is checked.

19. An adaptive hybrid ARQ apparatus using a concatenated FEC, the apparatus having a transmitter, the transmitter comprising:

an RS encoder for dividing transmission data into a header and payload and encoding each of them into an RS code;

an interleaver for generating header packets and payload packets corresponding to code rates by puncturing a signal encoded by the RS encoder, combining each header packet with each payload packet, and interleaving the combined packets; and a CPC encoder for combining the interleaved packets with different perforation patterns.

20. An adaptive hybrid ARQ apparatus using a concatenated FEC, the apparatus having a receiver, the receiver comprising:

a buffer for storing transmission packets received from a transmitter;

a CPC decoder for decoding the transmission packets stored in the buffer using different perforation patterns;

a deinterleaver for deinterleaving a signal generated by the CPC decoder, to generate header packets and payload packets; and an RS decoder for decoding the header packets and payload packets generated by the deinterleaver into RS codes.

21. The apparatus of claim 20, wherein the receiver performs error detection and reports error generation to the transmitter.

22. The apparatus of claim 21, wherein first and second headers and first and second payloads are combined to generate a first combined header and a first combined payload, when an error is detected, and wherein the first combined header and the first combined payload are decoded and checked for errors.

23. The apparatus of claim 20, wherein the transmitter comprises:

an RS encoder for dividing transmission data into a header and payload and encoding each of them into an RS code;

an interleaver for generating header packets and payload packets corresponding to code rates by puncturing a signal encoded by the RS encoder, combining each header packet with each payload packet, and interleaving the combined packets; and a CPC encoder for combining the interleaved packets with different perforation patterns.

* * * * *